United States Patent
Kudo et al.

(10) Patent No.: US 7,063,765 B2
(45) Date of Patent: Jun. 20, 2006

(54) ADHESIVE SHEET FOR AFFIXATION OF A WAFER AND METHOD FOR PROCESSING USING THE SAME

(75) Inventors: Kiyomitsu Kudo, Tokyo (JP); Akira Tsujimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/251,791

(22) Filed: Oct. 18, 2005

(65) Prior Publication Data

US 2006/0051573 A1    Mar. 9, 2006

Related U.S. Application Data

(62) Division of application No. 10/345,278, filed on Jan. 16, 2003, now abandoned.

(30) Foreign Application Priority Data

Jan. 24, 2002    (JP)    .............................. 2002-015681

(51) Int. Cl.
B32B 38/04    (2006.01)
B32B 38/10    (2006.01)
H01L 21/784    (2006.01)

(52) U.S. Cl. ...................... 156/258; 156/344; 438/464; 438/976

(58) Field of Classification Search ................ 156/268, 156/344, 584; 438/464, 976
See application file for complete search history.

(56) References Cited

U.S. PATENT DOCUMENTS

| | | | |
|---|---|---|---|
| 5,609,954 A * | 3/1997 | Aizawa et al. ........... 428/317.5 |
| 5,882,956 A * | 3/1999 | Umehara et al. ........... 438/114 |
| 5,976,691 A | 11/1999 | Noguchi et al. ............. 428/354 |
| 6,176,966 B1 | 1/2001 | Tsujimoto et al. .......... 156/344 |
| 6,319,754 B1 * | 11/2001 | Wang et al. ................. 438/113 |
| 6,398,892 B1 * | 6/2002 | Noguchi et al. ............... 156/85 |
| 6,472,065 B1 | 10/2002 | Alahapperuma et al. .... 428/343 |
| 6,488,803 B1 | 12/2002 | Kiuchi et al. ................ 156/230 |
| 6,627,037 B1 * | 9/2003 | Kurokawa et al. .......... 156/344 |
| 6,649,017 B1 * | 11/2003 | Kurokawa ................... 156/344 |
| 2001/0014492 A1 | 8/2001 | Noguchi et al. ............. 438/118 |
| 2003/0029544 A1 * | 2/2003 | Noguchi et al. ............... 156/85 |
| 2003/0031866 A1 | 2/2003 | Noguchi et al. ............. 428/345 |

FOREIGN PATENT DOCUMENTS

JP    7-86212    3/1995

* cited by examiner

*Primary Examiner*—Mark A. Osele
(74) *Attorney, Agent, or Firm*—Fitzpatrick, Cella, Harper & Scinto

(57) ABSTRACT

An adhesive sheet for affixation of a wafer includes a first substrate, first adhesive layer arranged on the first substrate, second substrate arranged on the first adhesive layer, and second adhesive layer arranged on the second substrate. A chemical reaction which causes reduction in the adhesion of the first adhesive layer and a chemical reaction which causes reduction in the adhesion of the second adhesive layer are different. A method for processing using this sheet includes the steps of affixing the sheet to a wafer, dicing the wafer with the sheet affixed thereto, peeling the first substrate and first adhesive layer away from the diced wafer by reducing the adhesion of the first adhesive layer and, thereby, dividing the wafer into a plurality of chips, and peeling the second substrate and second adhesive layer away from each of the chips by reducing the adhesion of the second adhesive layer.

3 Claims, 4 Drawing Sheets

US 7,063,765 B2

ADHESIVE SHEET FOR AFFIXATION OF A WAFER AND METHOD FOR PROCESSING USING THE SAME

This application is a divisional of application Ser. No. 10/345,278, filed Jan. 16, 2003, now abandoned the contents of which are incorporated herein by reference.

BACKGROUND OF THE INVENTION

1. Field of the Invention

The present invention relates to an adhesive sheet for affixation of a wafer and a method for processing using the same. More particularly, the present invention relates to an adhesive sheet for affixation of a wafer used in dicing of a semiconductor wafer into chips and to a method for dicing a semiconductor wafer by using the same.

2. Description of the Related Art

In general, semiconductor wafers made of silicon, gallium arsenide, etc., are manufactured in the condition of having a large diameter. This wafer is cut and separated (diced) into element chips and, thereafter, the resulting chips are subjected to a mounting step. Conventionally, the semiconductor wafer is subjected to each step of dicing, cleaning, drying, expanding, picking up and mounting in the condition of being affixed to an adhesive sheet in advance. As the adhesive sheet for affixation of a wafer used in dicing, sheets described in, for example, Japanese Patent Laid-Open No. 7-86212, are known. The adhesive sheet for affixation of a wafer described in Japanese Patent Laid-Open No. 7-86212 is composed of a radiation-setting adhesive layer arranged on a substrate. This sheet can be peeled away from a semiconductor wafer with ease by being irradiated with radioactive rays after dicing.

However, there is the following problem in the method for processing using the aforementioned conventional adhesive sheet for affixation of a wafer. That is, when there is another step between the steps of picking up and mounting, foreign matter, etc., may adhere to even a chip having been already cleaned and dried. In particular, since the back of the chip becomes a mounting surface, when adhesion of foreign matter, etc., occurs, problems of reduction in mounting precision, etc., are brought about.

SUMMARY OF THE INVENTION

It is an object of the present invention to provide a reliable adhesive sheet for affixation of a wafer capable of overcoming the aforementioned problems in the conventional technology and reducing adhesion of foreign matter, etc., before mounting of the chip.

The aforementioned object of the present invention can be achieved by an adhesive sheet for affixation of a wafer, the adhesive sheet including a first substrate, a first adhesive layer arranged on the first substrate, a second substrate arranged on the first adhesive layer, and a second adhesive layer arranged on the second substrate, wherein a chemical reaction which causes reduction in the adhesion of the first adhesive layer and a chemical reaction which causes reduction in the adhesion of the second adhesive layer are different.

Regarding the aforementioned adhesive sheet for affixation of a wafer, for example, the first adhesive layer can be formed from a radiation-setting adhesive, and the second substrate can be formed from a heat-shrinkable plastic film. Furthermore, the first substrate may be formed from a heat-shrinkable plastic film and the second adhesive layer may be formed from a radiation-setting adhesive.

A method for processing using the aforementioned adhesive sheet for affixation of a wafer includes the step of affixing the sheet to a wafer, the step of dicing the wafer with the sheet affixed thereto, the step of peeling the first substrate and the first adhesive layer away from the diced wafer by reducing the adhesion of the first adhesive layer of the sheet and, thereby, dividing the wafer into a plurality of chips, and the step of peeling the second substrate and the second adhesive layer away from each of the chips by reducing the adhesion of the second adhesive layer of the sheet.

Regarding the aforementioned method for processing, when the first adhesive layer is composed of a radiation-setting adhesive, and the second substrate is composed of a heat-shrinkable plastic film, the first substrate is peeled away from the wafer by irradiating the first adhesive layer with radioactive rays, and the second substrate is peeled away from each of the chips by being allowed to heat-shrink.

On the other hand, regarding the aforementioned method for processing, when the first substrate is composed of a heat-shrinkable plastic film, and the second adhesive layer is composed of a radiation-setting adhesive, the first substrate is peeled away from the wafer by being allowed to heat-shrink, and the second substrate is peeled away from each of the chips by irradiating the second adhesive layer with radioactive rays so as to cure the second adhesive layer.

Further objects, features and advantages of the present invention will become apparent from the following description of the preferred embodiments with reference to the attached drawings.

DESCRIPTION OF THE PREFERRED EMBODIMENTS

The embodiments of the present invention will be described below in detail with reference to the drawings.

(First Embodiment)

Figure 1:
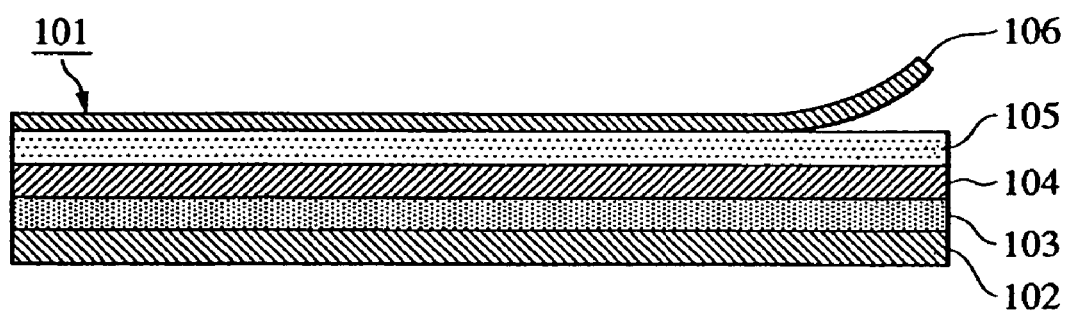
FIG. 1 is a schematic sectional view showing an adhesive sheet for affixation of a wafer according to a first embodiment of the present invention.

FIG. 1 is a schematic sectional view showing an adhesive sheet for affixation of a wafer according to a first embodiment of the present invention. As shown in FIG. 1, an adhesive sheet 101 for affixation of a wafer is composed of a first substrate 102, a first adhesive layer 103, a second substrate 104, and a second adhesive layer 105. In order to protect the second adhesive layer 105 before being subjected to use, preferably, a strippable sheet 106 is temporarily adhered on the second adhesive layer 105.

As the first substrate 102, preferably, a synthetic resin film having extensibility in the length direction and width direction is used. Specific examples of such films include polyethylene films, polypropylene films, polybutene films, poly(vinyl chloride) films, poly(ethylene terephthalate) films, poly(butylene terephthalate) films, polybutadiene films, polyurethane films, polymethylpentene films, ethylene-vinyl acetate films, ionomers, ethylene-methacrylic acid copolymer films, etc., and cross-linked films thereof. The first substrate 102 may be composed of a laminate of these films. In general, the film thickness of the first substrate 102 is 10 to 300 μm, and preferably, is 50 to 200 μm.

The first adhesive layer 103 is composed of a radiation-setting adhesive, and a system primarily containing the adhesive and a system primarily containing a radiation-polymerized synthetic oligomer are uniformly dispersed. The adhesion of this radiation-setting adhesive is significantly reduced by irradiation of radioactive rays.

The second substrate 104 is composed of a heat-shrinkable plastic film. Examples of such films suitably used include transparent films having been subjected to adequate extension processing and being made of, for example, polyolefins, e.g., polyethylene, polypropylene, and polymethylpentene, poly(vinyl chloride), polyester, and polystyrene. In particular, a film having a film thickness of 10 to 300 μm is preferable. The heat shrinkage factor (%) of this heat-shrinkable plastic film is preferably 5% or more in any one of the vertical direction and the horizontal direction of the film, more preferably, is 10% or more, and especially preferably, 20% or more.

The second adhesive layer 105 is composed of a material containing at least a partially cross-linked material of a carboxyl group—containing hydrophilic polymer in which a part of the carboxyl groups are partially neutralized and a surfactant. This surfactant is composed of at least one surfactant selected from the group consisting of anionic surfactants and cationic surfactants, and is in a liquid state at room temperature.

In order to peel the second substrate 104 and the second adhesive layer 105 away from the wafer affixed thereto, the second substrate 104 is heated so as to bring about heat-shrinkage. The heating is performed in a furnace or in a hot water bath. The heating temperature is determined depending on the material of the heat-shrinkable plastic film of the second substrate 104, and it is essential that the heating temperature is equivalent to or more than the temperature at which this heat-shrinkable plastic film brings about heat-shrinkage. However, the heating must be performed within the range in which circuits arranged on the wafer surface are not adversely-affected. Specifically, regarding the furnace, the heating is desirably performed at 60° C. to 200° C., and preferably, at 80° C. to 100° C. Desirably, the heating time is 20 seconds to 5 minutes, and preferably, is 40 seconds to 2 minutes. Regarding the hot water bath, desirably, the heating temperature is 60° C. to 100° C., and preferably, at 70° C. to 100° C., while the heating time is 20 seconds to 5 minutes, and preferably, is 40 seconds to 2 minutes. According to such a heating, the heat-shrinkable plastic film as the second substrate 104 is allowed to heat-shrink into the shape of a roll or cluster, and accompanying this, the adhesion of the second adhesive layer 105 is reduced.

Next, a method for processing a wafer by using the adhesive sheet for affixation of a wafer according to the first embodiment will be described with reference to schematic sectional views shown in FIG. 2A to FIG. 2D. In FIG. 2A to FIG. 2D, the same members are indicated by the same reference numerals.

Figure 2A:
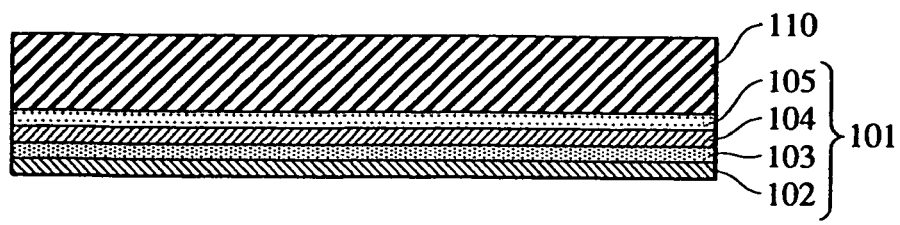
FIG. 2A to FIG. 2D are schematic sectional views for illustrating a method for processing a wafer by using the adhesive sheet for affixation of a wafer according to the first embodiment.

FIG. 2A shows the condition that the adhesive sheet 101 for affixation of a wafer according to the first embodiment is affixed to a silicon wafer 110. Reference numerals 102, 103, 104, and 105 denote the first substrate, first adhesive layer, second substrate, and second adhesive layer, respectively, similarly to those in FIG. 1.

Figure 2B:
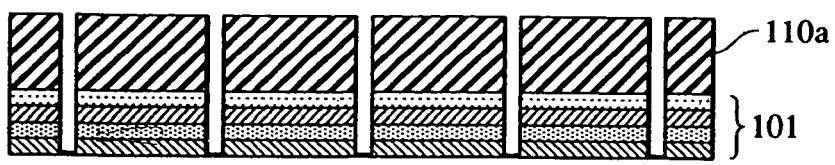

The silicon wafer 110 provided with the adhesive sheet 101 for affixation of a wafer by affixation is diced into the condition shown in FIG. 2B. Although the wafer 110 is cut into a plurality of silicon chips 110a, these are joined to each other by the sheet 101. Subsequently, radioactive rays are applied from the first substrate 102 side and, therefore, the adhesive of the first adhesive layer 103 is cured. According to this, the adhesion of the first adhesive layer 103 is significantly reduced and, therefore, the first substrate 102 and the first adhesive layer 103 can be peeled away from the wafer 110.

Figure 2C:
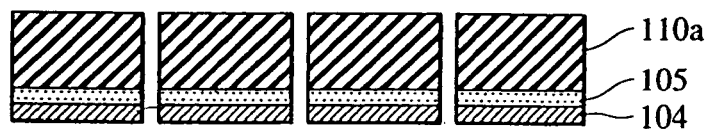

FIG. 2C shows the condition that the first substrate 102 and the first adhesive layer 103 have been peeled off. Individual silicon chips 110a are in the condition of being separated from each other, and under this condition, it is also possible to electrically connect by tape automated bonding (TAB) and inner lead bonding (ILB).

Figure 2D:
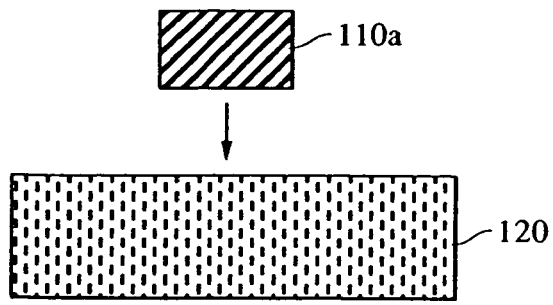

The separated individual silicon chips 110a are heated from the second substrate 104 side and, therefore, the second substrate 104 is allowed to heat-shrink. Accompanying this, the adhesion of the second adhesive layer 105 is reduced. Consequently, the second substrate 104 and the second adhesive layer 105 can be peeled away from the silicon chip 110a. As shown in FIG. 2D, the chip 110a after these are peeled away therefrom is mounted on a mount member 120 immediately after the peeling.

As described above, according to the present embodiment, since the silicon chip 110a is covered with the second substrate 104 as the back between the instant when the silicon wafer 110 is cut and the instant when the silicon chip 110a is mounted, adhesion of foreign materials, etc., can be prevented. Consequently, reduction in mounting precision due to adhesion of foreign materials, etc., can be avoided during mounting and, therefore, a semiconductor chip having high reliability can be provided.

(Second Embodiment)

Figure 3:
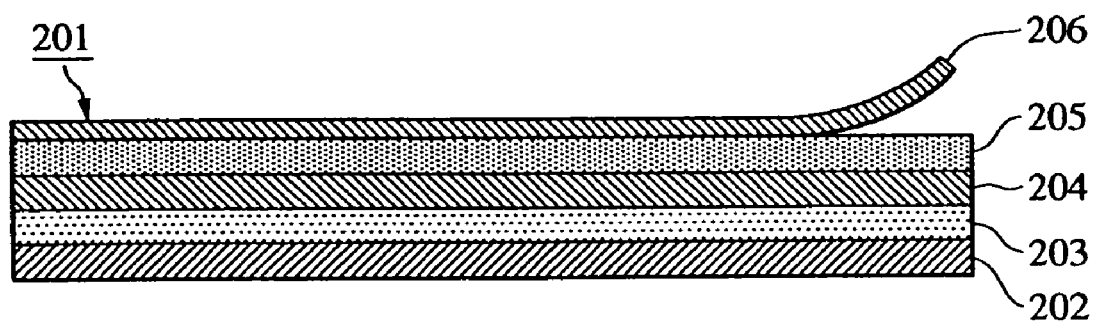
FIG. 3 is a schematic sectional view showing an adhesive sheet for affixation of a wafer according to a second embodiment of the present invention.

FIG. 3 is a schematic sectional view showing an adhesive sheet for affixation of a wafer according to a second embodiment of the present invention. As shown in FIG. 3, an adhesive sheet 201 for affixation of a wafer is composed of a first substrate 202, a first adhesive layer 203, a second substrate 204, and a second adhesive layer 205. In order to protect the second adhesive layer 205 before being subjected to use, preferably, a strippable sheet 206 is temporarily adhered on the second adhesive layer 205.

The first substrate 202 is composed of a heat-shrinkable plastic film. The material, thickness, and heat shrinkage factor suitably adopted for this film are similar to those for the second substrate 104 in the first embodiment. As the first adhesive layer 203, one similar to the second adhesive layer 105 in the first embodiment is used suitably.

The peeling of the first substrate 202 and the first adhesive layer 203 is performed by heating the second substrate 104 so as to bring about heat-shrinkage. The heating is performed in a furnace or in a hot water bath. Regarding the heating temperature and the heating time, suitable conditions are similar to those in the peeling of the second substrate 104 and the second adhesive layer 105 in the first embodiment.

As the second substrate 204, preferably, a synthetic resin film having extensibility in the length direction and width direction is used. The specific material and suitable thickness of such a film can be similar to those of the first substrate 102 in the first embodiment. As the second adhesive layer 205, a radiation-setting adhesive similar to the first adhesive layer 103 in the first embodiment can be used suitably.

Next, a method for processing a wafer by using the adhesive sheet for affixation of a wafer according to the second embodiment will be described with reference to schematic sectional views shown in FIG. 4A to FIG. 4D. In FIG. 4A to FIG. 4D, the same members are indicated by the same reference numerals.

Figure 4A:
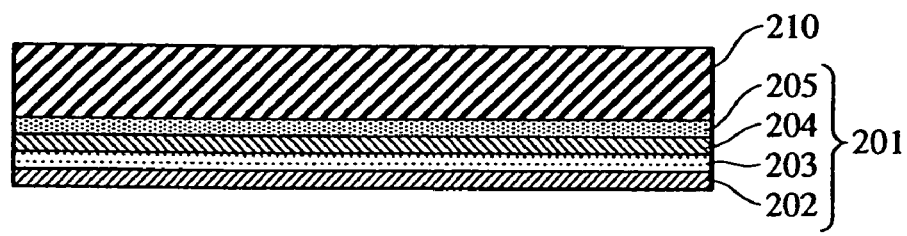
FIG. 4A to FIG. 4D are schematic sectional views for illustrating a method for processing a wafer by using the adhesive sheet for affixation of a wafer according to the second embodiment.

FIG. 4A shows the condition that the adhesive sheet 201 for affixation of a wafer according to the second embodiment is affixed to a silicon wafer 210. Reference numerals 202, 203, 204, and 205 denote the first substrate, first adhesive layer, second substrate, and second adhesive layer, respectively, similarly to those in FIG. 3. The silicon wafer 210 in the present embodiment has openings arranged by anisotropic etching from the back of the silicon wafer. Since openings are arranged, it is possible to use the chips for an ink feed path in an ink-jet head.

Figure 4B:
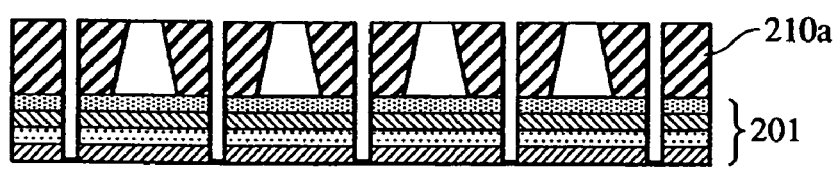

The silicon wafer 210 provided with the adhesive sheet 201 for affixation of a wafer by affixation is diced into the condition shown in FIG. 4B. Although the wafer 210 is cut into a plurality of silicon chips 210a, these are joined to each other by the sheet 201. Subsequently, heating is performed from the first substrate 202 side and, therefore, the first substrate 202 is allowed to shrink. As a result, the adhesion of the first adhesive layer 203 is significantly reduced and, therefore, the first substrate 202 and the first adhesive layer 203 can be peeled away from the wafer 210.

Figure 4C:
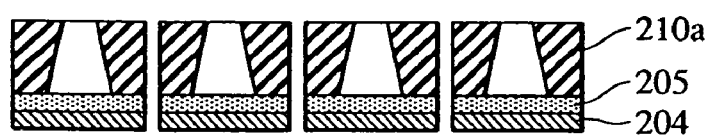

FIG. 4C shows the condition that the first substrate 202 and the first adhesive layer 203 have been peeled off. Individual silicon chips 210a are in the condition of being separated from each other, and under this condition, it is also possible to electrically connect by TAB and ILB.

Figure 4D:
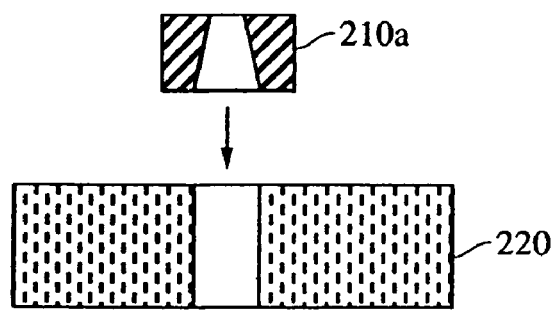

The separated individual silicon chips 210a are irradiated with radioactive rays from the second substrate 204 side and, therefore, the second adhesive layer 205 is cured so that the adhesive thereof is significantly reduced. Consequently, the second substrate 204 and the second adhesive layer 205 can be peeled away from the silicon chip 210a. As shown in FIG. 4D, the chip 210a, after these are peeled away therefrom, is mounted on a mount member 220 immediately after the peeling. As described above, according to the present embodiment, since the silicon chip 210a is covered with the second substrate 204 as the back between the instant when the silicon wafer 210 is cut and the instant when the silicon chip 210a is mounted, adhesion of foreign materials, etc., can be prevented. Consequently, reduction in mounting precision due to adhesion of foreign materials, etc., can be avoided during mounting and, therefore, a semiconductor chip having high reliability can be provided. When the silicon chip having an opening for an ink feed path in an ink-jet head is used, intrusion of foreign materials into the opening causes non-ejection during ejection of ink. However, when the adhesive sheet for affixation of a wafer according to the present embodiment is used, intrusion of foreign materials into the opening can be reduced and, therefore, significant improvement of the reliability in manufacture of the ink-jet head is achieved.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for processing a wafer by using an adhesive sheet including (i) a first substrate, (ii) a first adhesive layer arranged on the first substrate, (iii) a second substrate arranged on the first adhesive layer, and (iv) a second adhesive layer arranged on the second substrate, wherein a chemical reaction which causes reduction in the adhesion of the first adhesive layer and a chemical reaction which causes reduction in the adhesion of the second adhesive layer are different, the method comprising:
   a first step of affixing the adhesive sheet to the wafer such that the second adhesive layer is disposed between the wafer and the second substrate;
   a second step of dicing the wafer into a plurality of chips, wherein the wafer is diced with the adhesive sheet affixed thereto, such that the second adhesive layer and the second substrate are diced together with the wafer without dicing the first substrate;
   a third step of peeling the first adhesive layer and the first substrate from the diced wafer by reducing adhesion of the first adhesive layer and, thereby, disjoining the plurality of chips from one another, wherein each of the disjoined plurality of chips has a portion of the second substrate affixed thereto by a portion of the second adhesive layer; and
   a fourth step of peeling the portion of the second adhesive layer and the portion of the second substrate from each of the plurality of chips by reducing the adhesion of the portion of the second adhesive layer.

2. A method for processing a wafer by using an adhesive sheet including (i) a first substrate, (ii) a first adhesive layer arranged on the first substrate, (iii) a second substrate arranged on the first adhesive layer and (iv) a second adhesive layer arranged on the second substrate, wherein the first adhesive layer comprises a radiation-setting adhesive, and the second substrate comprises a heat-shrinkable plastic film, the method comprising:
   a first step of affixing the adhesive sheet to the wafer such that the second adhesive layer is disposed between the wafer and the second substrate;
   a second step of dicing the wafer into a plurality of chips, wherein the wafer is diced with the adhesive sheet affixed thereto, such that the second adhesive layer and the second substrate are diced together with the wafer without dicing the first substrate;
   a third step of peeling the first adhesive layer and the first substrate from the diced wafer by irradiating the first adhesive layer with radiation and, thereby, disjoining the plurality of chips from one another, wherein each of said disjoined plurality of chips has a portion of the second substrate affixed thereto by a portion of the second adhesive layer; and
   a fourth step of peeling the portion of the second adhesive layer and the portion of the second substrate from each of the plurality of chips by heat-shrinking the portion of the second substrate.

3. A method for processing a wafer by using an adhesive sheet including (i) a first substrate, (ii) a first adhesive layer arranged on the first substrate, (iii) a second substrate arranged on the first adhesive layer, and (iii) a second adhesive layer arranged on the second substrate, wherein the first substrate comprises a heat-shrinkable plastic film, and the second adhesive layer comprises a radiation-setting adhesive, the method comprising:
- a first step of affixing the adhesive sheet to the wafer such that the second adhesive layer is disposed between the wafer and the second substrate;
- a second step of dicing the wafer into a plurality of chips, wherein the wafer is diced with the adhesive sheet affixed thereto such that the second adhesive layer and the second substrate are diced together with the wafer without dicing the first substrate;
- a third step of peeling the first adhesive layer and the first substrate from the plurality of chips by heat-shrinking the first substrate and, thereby, disjoining the plurality of chips from one another, wherein each of said disjoined plurality of chips has a portion of the second substrate affixed thereto by a portion of the second adhesive layer; and
- a fourth step of peeling the portion of the second adhesive layer and the portion of the second substrate from each of the plurality of chips by irradiating the portion of the second adhesive layer with radiation.

* * * * *